(12) United States Patent
Hong

(10) Patent No.: US 10,886,257 B2
(45) Date of Patent: Jan. 5, 2021

(54) MICRO LED DISPLAY DEVICE AND METHOD FOR MANUFACTURING SAME

(71) Applicant: KAISTAR Lighting (Xiamen) Co., Ltd., Xiamen (CN)

(72) Inventor: Steve Mengyuan Hong, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/183,073

(22) Filed: Nov. 7, 2018

(65) Prior Publication Data
US 2019/0157523 A1    May 23, 2019

(30) Foreign Application Priority Data
Nov. 20, 2017    (CN) .......................... 2017 1 1160105

(51) Int. Cl.
| | |
|---|---|
| *H01L 25/075* | (2006.01) |
| *H01L 33/54* | (2010.01) |
| *H01L 27/12* | (2006.01) |
| *H01L 33/48* | (2010.01) |
| *H01L 33/56* | (2010.01) |
| *H01L 33/62* | (2010.01) |

(Continued)

(52) U.S. Cl.
CPC ...... *H01L 25/0753* (2013.01); *H01L 27/1214* (2013.01); *H01L 27/1218* (2013.01); *H01L 27/1248* (2013.01); *H01L 27/1262* (2013.01); *H01L 27/1292* (2013.01); *H01L 33/0093* (2020.05); *H01L 33/483* (2013.01); *H01L 33/502* (2013.01); *H01L 33/54* (2013.01); *H01L 33/56* (2013.01); *H01L 33/62* (2013.01); *H01L 2933/005* (2013.01); *H01L 2933/0041* (2013.01); *H01L 2933/0066* (2013.01)

(58) Field of Classification Search
CPC ............ H01L 25/0753; H01L 33/0079; H01L 33/502; H01L 33/56; H01L 33/62; H01L 2933/0041; H01L 2933/005; H01L 2933/0066; H01L 33/005
See application file for complete search history.

(56) References Cited

U.S. PATENT DOCUMENTS

| | | | | |
|---|---|---|---|---|
| 6,586,268 | B1 * | 7/2003 | Kopola ................ | H01G 9/2027 438/22 |
| 2004/0129946 | A1 * | 7/2004 | Nagai ....................... | F21K 9/00 257/98 |

(Continued)

*Primary Examiner* — Feifei Yeung Lopez
(74) *Attorney, Agent, or Firm* — Hemisphere Law, PLLC; Zhigang Ma

(57) ABSTRACT

The present application relates to a micro LED display device and, a method for manufacturing the same. The method includes the following steps. First, a plurality of LED chips are formed on a supplying substrate. Next, a first substrate defining a plurality of groups of printed circuits is provided. Then the supplying substrate is overlaid in an inverted manner on the first substrate in such a manner that the LED chips are aligned with and attached onto the groups of printed circuits correspondingly. After the LED chips are detached from the supplying substrate, the supplying substrate is removed. Then a sol-gel glass is filled into gaps among the LED chips. Finally a second substrate is bonded with the first substrate. The present disclosure is capable of improving the yield rate and the reliability.

17 Claims, 4 Drawing Sheets

(51) Int. Cl.
*H01L 33/50* (2010.01)
*H01L 33/00* (2010.01)

(56) References Cited

U.S. PATENT DOCUMENTS

| | | | |
|---|---|---|---|
| 2005/0077820 A1* | 4/2005 | Onishi | H01L 51/5262 313/506 |
| 2009/0064924 A1* | 3/2009 | Pedrini | C04B 41/009 118/50 |
| 2011/0254039 A1* | 10/2011 | Kim | H01L 24/97 257/98 |
| 2015/0362165 A1* | 12/2015 | Chu | H01L 27/156 362/235 |
| 2017/0025399 A1* | 1/2017 | Takeya | H01L 33/502 |
| 2017/0179097 A1* | 6/2017 | Zhang | H01L 27/156 |
| 2017/0294418 A1* | 10/2017 | Edmond | H01L 33/502 |

* cited by examiner

MICRO LED DISPLAY DEVICE AND METHOD FOR MANUFACTURING SAME

FIELD OF THE DISCLOSURE

The disclosure relates to the field of display technologies, and more particularly to a micro light emitting diode display device and a method for manufacturing a micro light emitting diode display device.

BACKGROUND

A micro light emitting diode (LED) is a component having a size of several microns to several hundreds of microns. Since its size is only 1% of that of an ordinary LED, distance between pixels can also be reduced from the original millimeter level to micron level.

A micro light emitting diode display is a display using a high density micro LED array as a display pixel array. Inheriting the characteristics of LED, the advantages of micro LED include low power consumption, high brightness, ultra-high resolution and color saturation, fast response, superior power saving, long life, and high efficiency. In particular, its power consumption requires only 10% of a liquid crystal display (LCD) or 50% of an organic light emitting display (OLED). Moreover, compared with the organic light-emitting display, which is also a self-luminous display, the brightness is still 30 times higher than that and the resolution can reach 1500 PPI. In addition, it also has the advantages of better material stability and no image imprinting.

Currently, methods for manufacturing a micro LED array includes chip bonding, wafer bonding, or thin film transferring. In the chip bonding process, the micro LED assembly must be manufactured on a supplying substrate first, due to lattice matching, and then the micro LED bare chip is separated from the supplying substrate by laser lift-off (LLO). Next, micro transfer print (MTP) is performed to transfer the LED bare chip to a receiving substrate previously prepared a circuit pattern, thereby forming the micro LED array. However, in the process of manufacturing the micro LED array by the MTP technology, a transfer head is required to transfer the micro LED array, and the structure of the transfer head is relatively complicated, the reliability is low, and additional manufacturing costs are required. Due to the above-mentioned many problems with the transfer head, the technology of wafer bonding has received attention and development in the field.

SUMMARY

On such basis, the present disclosure provides a micro light emitting diode display device and a method for manufacturing the same, capable of improving yield and reliability.

The present disclosure provides a method for manufacturing a micro light emitting diode display device, the method comprising the following steps: forming a plurality of light emitting diode chips on a supplying substrate; providing a first substrate, wherein the first substrate defines a plurality of groups of printed circuits; overlaying the supplying substrate in an inverted manner on the first substrate, and making the plurality of light emitting diode chips aligned with and attached onto the plurality of groups of printed circuits; detaching the plurality of light emitting diode chips from the supplying substrate; removing the supplying substrate; forming a sol-gel glass on the first substrate, wherein the sol-gel glass is filled into gaps among the plurality of light emitting diode chipss; and bonding a second substrate onto the first substrate.

In one embodiment, the surface of the second substrate attaching to the first substrate defines a plurality of phosphor films corresponding to the light emitting diode chips one by one.

In one embodiment, the first substrate and/or the second substrate are/is a glass substrate(s).

In one embodiment, the step of forming the sol-gel glass on the first substrate comprising: forming the sol-gel glass covering the plurality of light emitting diode chips and the plurality of groups of printed circuits; and grinding the sol-gel glass until upper surfaces of the plurality of light emitting diode chips are exposed.

In one embodiment, after overlaying the supplying substrate in an inverted manner on the first substrate comprising: forming a solder layer on the plurality of groups of printed circuits; and reflow soldering the solder layer.

In one embodiment, forming the sol-gel glass on the first substrate is performed in a vacuum environment.

In one embodiment, each of the plurality of light emitting diode chips comprises a first metal electrode and a second metal electrode, each of the plurality of groups of printed circuits comprises a first driving electrode and a second driving electrode, when the plurality of light emitting diode chips are aligned with and attached onto the plurality of groups of printed circuits, each the first metal electrode is attached to the first driving electrode aligned therewith, each the second metal electrode is attached to the second driving electrode aligned therewith.

The present disclosure also provides a micro light emitting diode display device, the micro light emitting diode display device includes a first substrate comprising a plurality of groups of printed circuits, a plurality of light emitting diode chips aligned with and attached to the plurality of groups of printed circuits, a sol-gel glass filled into gaps among the plurality of light emitting diode chips, a plurality of phosphor films correspondingly formed onto upper surfaces of the plurality of light emitting diode chips, and a second substrate located on the plurality of phosphor films and bonded to the first substrate.

In one embodiment, the first substrate and/or the second substrate are/is a glass substrate(s).

In one embodiment, each group of printed circuits comprises a first driving electrode and a second driving electrode, a lower surface of each light emitting diode chip is formed with a first metal electrode and a second metal electrode, and each first metal electrode is attached onto a corresponding first driving electrode, each second metal electrode is attached onto a corresponding second driving electrode.

In one embodiment, the micro light emitting diode display device further comprises a solder layer, the solder layer is located between the first metal electrode and the first driving electrode as well as located between the second metal electrode and the second driving electrode.

In one embodiment, the distance between the first metal electrode and the first driving electrode is different to the distance between the second metal electrode and the second driving electrode.

In one embodiment, the solder layer defines different thickness at different locations.

In one embodiment, each of the plurality of light emitting diode chips comprises an N-type semiconductor layer, a light emitting layer, and a P-type semiconductor layer arranged in sequence, a portion of the N-type semiconductor layer is exposed.

In one embodiment, each of the plurality of light emitting diode chips each further comprise a first metal electrode and a second metal electrode, the first metal electrode is in contact with the P-type semiconductor layer, and the second metal electrode is in contact with the exposed N-type semiconductor layer.

In one embodiment, each group of printed circuits comprises a first driving electrode and a second driving electrode, each first metal electrode is aligned and electrically communicating with a corresponding first driving electrode, each second metal electrode is aligned and electrically communicating with a corresponding second driving electrode.

In one embodiment, a solder layer is sandwiched between the first metal electrode and the first driving electrode as well as sandwiched between the second metal electrode and the second driving electrode.

The micro LED display device and method for manufacturing the same of the present disclosure, can greatly increase yield and reliability. Since the sol-gel glass is applied and coated in a vacuum environment to be filled into gaps among adjacent LED chips, it can fully and adequately fill all gaps among related components. In addition to the effect of flattening the surface of the micro LED array, it can further provides the effect of fixing and supporting the micro LEDs, thereby reducing the chance of breakage of the micro LED related components.

The above description is merely an overview of the technical solution of the present disclosure. In order to more clearly understand the technical means of the present disclosure, implement in accordance with the contents of the specification, and the above and other objects, features, and advantages of the present disclosure can be more clearly understood, the following is a detailed description of the preferred embodiment and the accompanying drawings.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1A:
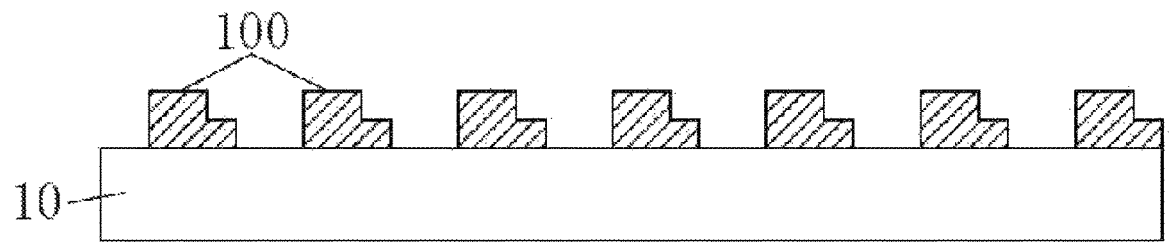
FIG. 1a to FIG. 1f are cross-sectional views of substrates of a micro LED display device, illustrating a method for manufacturing a micro LED display device of the present disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

FIG. 1a to FIG. 1f are cross-sectional views of substrates of a micro LED display device, illustrating a method for manufacturing a micro LED display device in one embodiment of the disclosure.

As shown in FIG. 1a, a supplying substrate 10 is provided, and a plurality of LED chips 100 are formed on the supplying substrate 10. The plurality of LED chips 100 are distributed on the supplying substrate 10 in a matrix array. In one embodiment, the supplying substrate 10 is a sapphire substrate. The LED chips 100 each can be prepared as follows. Firstly, a desired N type semiconductor layer, a light emitting layer, and a P type semiconductor layer are sequentially deposited on the supplying substrate 10, and then a photolithographic etching step is performed to form the plurality of LED chips 100 distributed in an array.

Figure 1B:
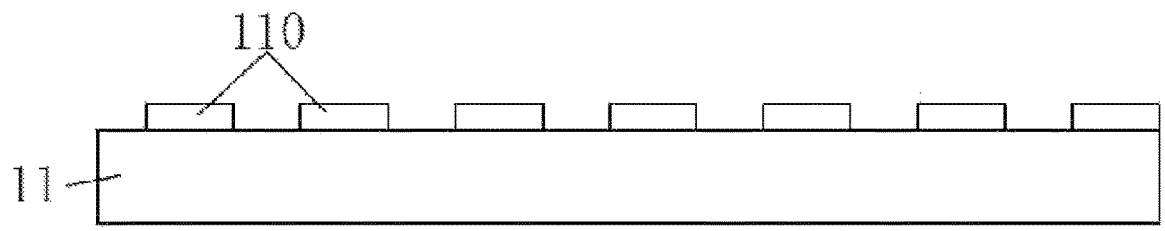

Next, as shown in FIG. 1b, a first substrate 11 is provided, the first substrate 11 has a plurality of groups of printed circuits 110 printed thereon. In one embodiment, the first substrate 11 is a glass substrate. With regard to the groups of printed circuits 110, as shown in the figure, the plurality of groups of printed circuits 110 corresponding to the plurality of LED chips 100 on the supplying substrate 10, one by one. That is, the distribution manner of the plurality of groups of printed circuits 110 on the first substrate 11 is the same and corresponds to the distribution manner of the plurality of LED chips 100 on the supplying substrate 10. In one embodiment, the first substrate 11 can be used as an active component array substrate in a display panel. That is, an upper surface of the first substrate 11 can be divided into a plurality of pixel regions distributed in an array. Each pixel region includes three sub-pixel regions of red, blue, and green. The printed circuits 110 in each sub-pixel region include a thin film transistor and a capacitor, configured for connecting with a corresponding LED chip 100 and thereby controlling and driving the LED chip 100 to emit light.

Figure 1C:
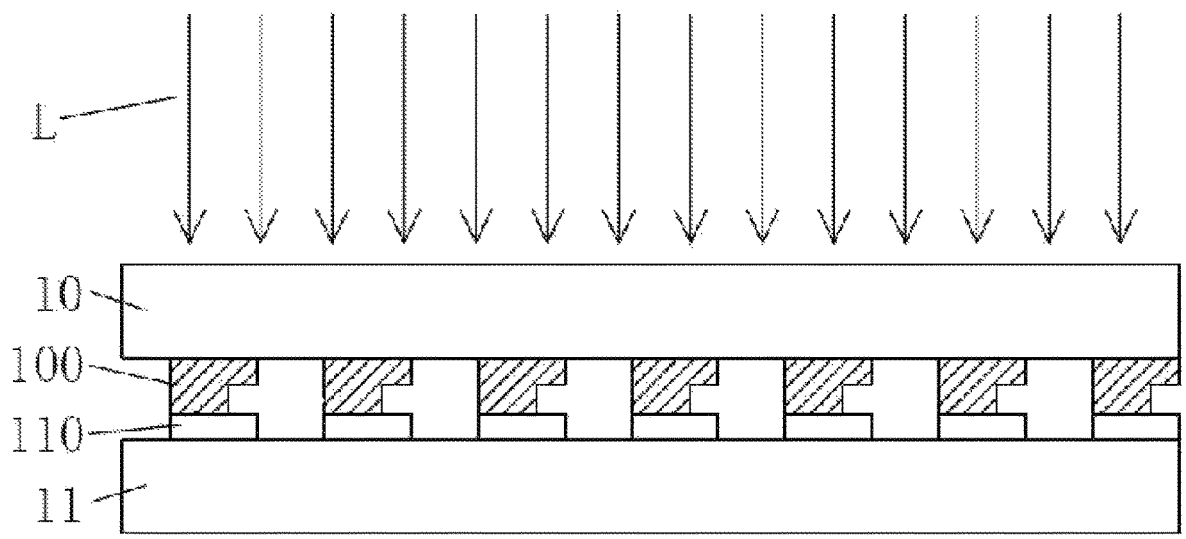

As shown in FIG. 1c, the supplying substrate 10 is inverted and overlaid on the first substrate 11, and the LED chips 100 are aligned with and attached onto the groups of printed circuits 110 correspondingly. In one embodiment, a solder layer may be applied between the LED chips 100 and the groups of printed circuits 110 to connect and bond the LED chips 100 and the groups of printed circuits 110. That is, in the step of overlaying the supplying substrate 10 in an inverted manner onto the first substrate 11, the solder layer is printed on the groups of printed circuits 110 of the first substrate 11, and then reflow soldering is performed to the solder layer, thereby bonding the LED chips 100 and the groups of printed circuits 110.

In addition, as described above, due to that the distribution manner of the plurality of groups of printed circuits 110 on the first substrate 11 is substantially the same as the distribution manner of the plurality of the LED chips 100, and the spaced distance between the groups of printed circuits 110 is corresponding to the spaced distance between the LED chips 100, when the supplying substrate 10 is overlaid on the first substrate 11 in an inverted manner, each LED chip 100 is exactly aligned with and corresponds to one group of printed circuits 110. So each LED chip 100 can be attached to an upper surface of the corresponding group of printed circuits 110.

Next, as shown in FIG. 1c, each LED chip 100 is detached from the supplying substrate 10 and then fixed on the corresponding group of printed circuits 110 in such a manner that the supplying substrate 10 is irradiated with laser light L, for example. Each LED chip 100 is bonded to a corresponding sub-pixel region of the first substrate 11 to complete the manufacture of the micro LED array. In addition to the laser irradiation manner, the LED chips 100 can also be separated from the supplying substrate 10 by etching in one embodiment.

Figure 1D:
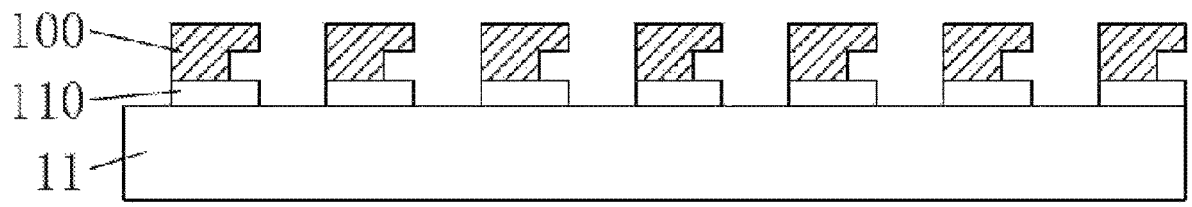

After the step of detaching the LED chips 100 from the supplying substrate 10, the supplying substrate 10 can be removed as shown in FIG. 1d.

Figure 1E:
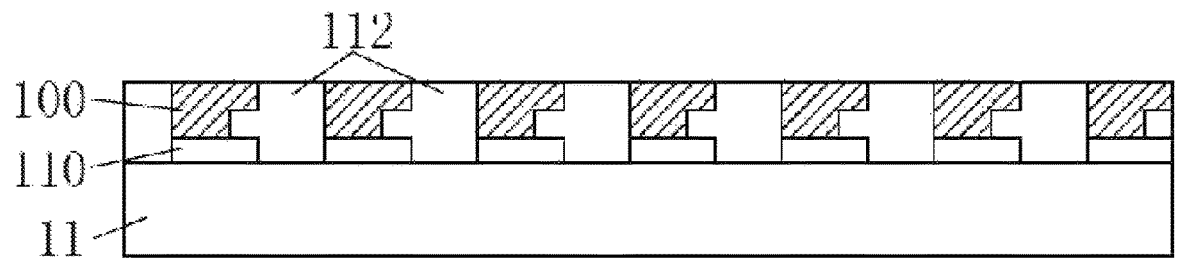

Next, referring to FIG. 1e, a sol-gel glass (SOG) 112 is formed on the first substrate 11 and adequately/completely filled into gaps among the LED chips 100. In one embodiment, the step of forming the sol-gel glass 112 on the first substrate 11 is performed in a vacuum environment.

Figure 1F:
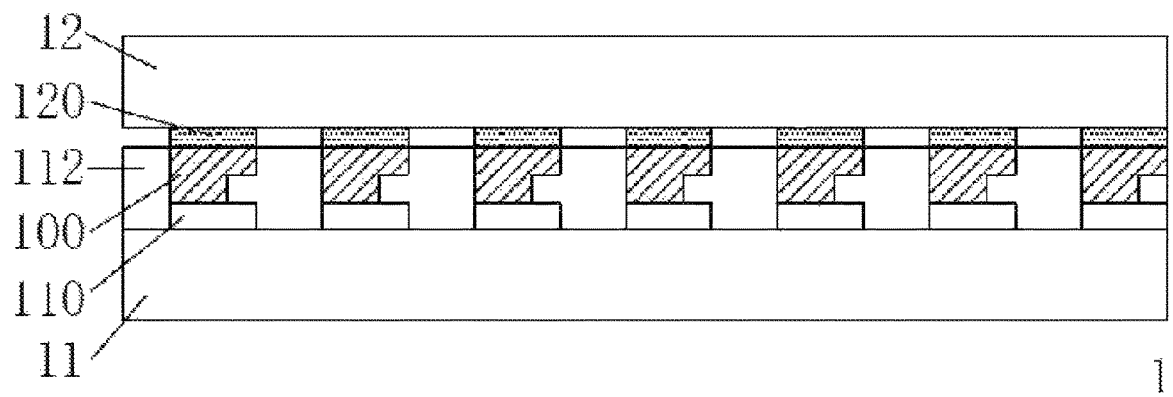

Then, as shown in FIG. 1f, a second substrate 12 is bonded onto the first substrate 11.

In one embodiment, when the sol-gel glass 112 is formed on the first substrate 11, the sol-gel glass 112 covers the LED chips 100 and the groups of printed circuits. 110. The sol-gel glass 112 is ground until upper surfaces of the LED chips 100 are exposed.

In one embodiment, the second substrate 12 defines a plurality of phosphor films 120 thereon, and the phosphor films 120 are corresponding to and aligned with the LED chips 100. As shown in the figure, the plurality of phosphor films 120 are arranged on the second substrate 12 in an array and respectively correspond to the plurality of LED chips 100. That is, the distribution manner of the plurality of phosphor films 120 on the second substrate 12 is the same and corresponds to the distribution manner of the LED. chips 100 on the first substrate 11. Therefore, when the second substrate 12 is covered on the first substrate 11, each of the phosphor films 120 is located on a corresponding LED chip 100, specifically the upper surface of each LED chip 100 is provided and in contact with a corresponding phosphor film 120. In addition, the second substrate 12 is a glass substrate in one embodiment.

In one embodiment, the method of forming the phosphor films 120 on a surface of the second substrate 12 is not limited, and it may be a method of attaching a film layer, or a method of coating or spraying phosphor powders. The formed phosphor films 120 are also arranged in a matrix array and corresponding to the LED chips 100 one by one.

Except for forming the phosphor films 120 on the surface of the second substrate 12, the phosphor films 120 may be directly formed on the upper surfaces of the LED chips 100 in one embodiment. In addition, the phosphor films 120 are made with different phosphors according to the color of the corresponding sub-pixel region. In this way, when blue lights or ultraviolet lights emitted from the LED chips 100 are irradiated on the upper phosphor films 120, different phosphors are excited, and different light rays such as red light, blue light, and green light are respectively generated.

Figure 2:
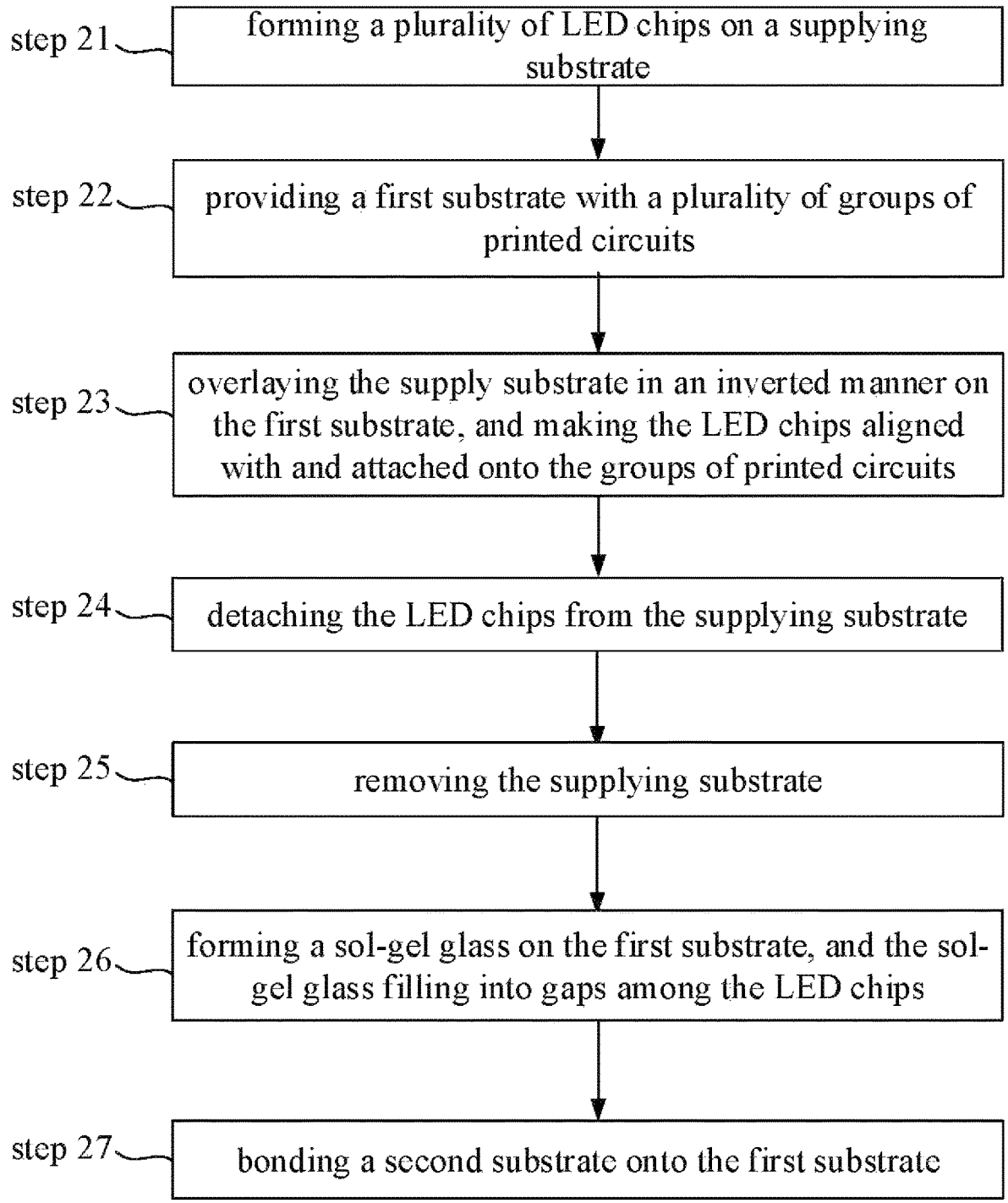
FIG. 2 is a flow chart of the method for manufacturing a micro LED display device according to one embodiment of the present disclosure.

Please referring to FIG. 2, FIG. 2 is a flow chart of a method for manufacturing a micro LED display device according to the disclosure. Steps of the method are described as follows. Please also refer to the cross-sectional views of the micro LED display device substrates shown in FIG. 1a to FIG. 1h. First, the LED chips 100 are formed on the supplying substrate 10, in step 21. Next, the first substrate 11 is provided in step 22, the first substrate 11 defines the plurality of groups of printed circuits 110 thereon. Then, the supplying substrate 10 is overlaid in an inverted manner on the first substrate 11, and the LED chips 100 are correspondingly aligned with and attached onto the printed circuits 110 in step 23. After that, the LED chips 100 can be detached from the supplying substrate 10 by means of laser irradiation or etching, in step 24. And, the supplying substrate 10 is removed in step 25. Next, the sol-gel glass 112 is formed on the first substrate 11 and filled into gaps among the LED chips 100, in step 26. Finally, the second substrate 12 is bonded to the first substrate 11 in step 27.

The present disclosure also discloses a structure of a micro LED display device. As shown in FIG. 1f, the main components of the micro LED display device 1 are described below. The micro LED display device 1 includes the first substrate 11, the plurality of LED chips 100, the sol-gel glass 112, the plurality of phosphor films 120, and the second substrate 12. The upper surface of the first substrate 11 is provided with the plurality of groups of printed circuits 110. The plurality of LED chips 100 are aligned with and attached onto the groups of printed circuits 110 correspondingly. The sol-gel glass 112 is adequately filled into gaps among the LED chips. The plurality of phosphor films 120 are correspondingly formed on and aligned with the upper surfaces of the LED chips 100. The second substrate 12 is located on the phosphor films 120 and adhered to the first substrate 11.

In one embodiment, the plurality of groups of printed circuits 110 are arranged in a matrix array on the upper surface of the first substrate 11, and each group of printed circuits 110 correspond to one sub-pixel region. The plurality of LED chips 100 correspond to and aligned with the plurality of groups of printed circuits 110 one by one.

In addition, the sol-gel glass 112 adequately fills the gaps among the adjacent LED chips 100, and adequately fills the gap among the adjacent printed circuits 110. As shown in the figure, the sol-gel glass 112 covers the first substrate 11 and the printed circuits 110, and exposes only the upper surfaces of the LED chips 100.

In another embodiment, the first substrate 11 and the second substrate 12 may be selected from transparent substrates, such as glass substrates.

Figure 3A:
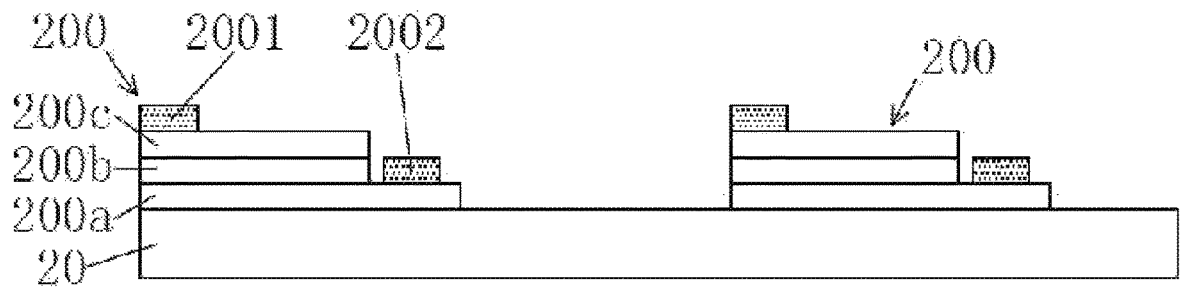
FIG. 3a is a cross-sectional view of a substrate of a micro LED display device; showing LED chips formed on a supplying substrate.
Figure 3B:
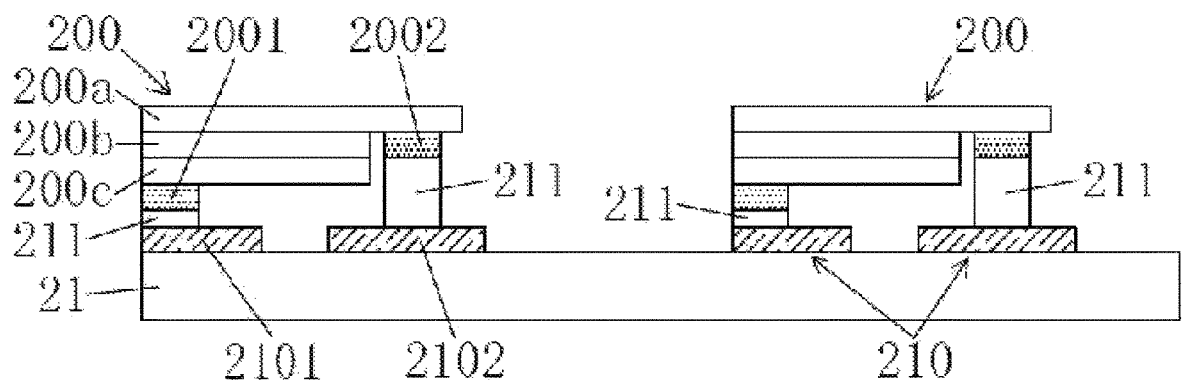
FIG. 3b is a cross-sectional view of a substrate of a micro LED display device, showing LED chips attached onto a first substrate.
Figure 3C:
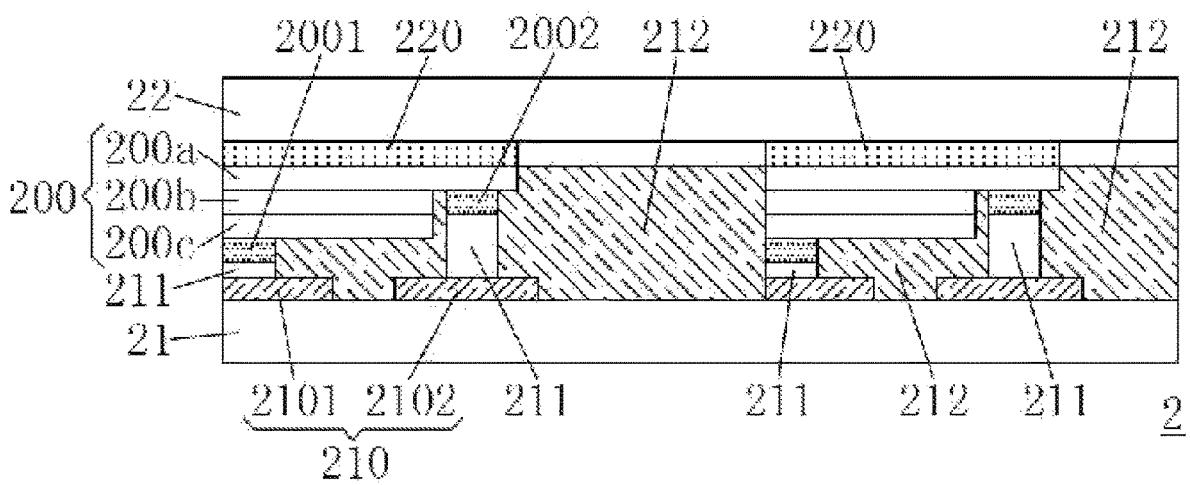
FIG. 3c is a cross-sectional view showing a manufactured micro LED display device.

Referring to FIG. 3a to FIG. 3b, these figures show the detailed structures of the LED chips. FIG. 3a shows LED chips manufactured on a supplying substrate, and FIG. 3b shows LED chips attached on a first substrate. In addition, FIG. 3c shows a manufactured micro LED display device.

Referring to FIG. 3a, a plurality of LED chips 200 are provided on a supplying substrate 20. The plurality of LED chips 200 are distributed on the supplying substrate 20 in a matrix array. In one embodiment, the supplying substrate 20 is a sapphire substrate. The LED chips 200 each include at least an N-type semiconductor layer 200a, a light emitting layer 200b, a P-type semiconductor layer 200c, a first metal electrode 2001, and a second metal electrode 2002. Here, the N-type semiconductor layer 200a is formed on an upper surface of the supplying substrate 20, the light-emitting layer 200b is formed on an upper surface of the N-type semiconductor layer 200a, and the P-type semiconductor layer 200c is formed on an upper surface of the light-emitting layer 200b.

In one embodiment, the size of the light emitting layer 200b and the P-type semiconductor layer 200c is smaller than that of the N-type semiconductor layer 200a, so when the light emitting layer 200b and the P-type semiconductor layer 200c are deposited on the N-type semiconductor layer 200a, they will not completely shield the N-type semiconductor layer 200a, and a portion of the N-type semiconductor layer 200a is exposed. The first metal electrode 2001 and the second metal electrode 2002 are subsequently formed and are respectively located on an upper surface of the P-type semiconductor layer 200c and the upper surface of the N-type semiconductor layer 200a, as shown in FIG. 3a.

Referring to FIG. 3b, after the LED chips 200 are aligned with and attached onto a plurality of groups of printed circuits 210 on a first substrate 21, the LED chips 200 located on the first substrate 21 will be in an inverted state compared with the state in FIG. 3a. This is because the alignment of the LED chips 200 is performed by inverting the supplying substrate 20 onto the first substrate 21. That is, the first metal electrode 2001 and the second metal electrode 2002 of the LED chip 200 become a lower surface of the LED chip 200 and are aligned with a corresponding group of printed circuits 210 below it.

In one embodiment, each group of printed circuits 210 includes a first driving electrode 2101 and a second driving electrode 2102. When the LED chips 200 are aligned to the groups of printed circuits 210, each first metal electrode 2001 is attached onto a corresponding driving electrode 2101, and each second metal electrode 2002 is attached onto a corresponding second driving electrode 2102.

In one embodiment, there is a solder layer 211 between each LED chip 200 and the corresponding group of printed circuits 210, the solder layer 211 is configured for connecting and bonding the LED chip 200 and the corresponding group of printed circuits 210. That is, the solder layer 211 is located between the first metal electrode 2001 and the first driving electrode 2101 as well as located between the second metal electrode 2002 and the second driving electrode 2102, so as to bond the LED chip 200 onto the printed circuits 210.

In one embodiment, as shown in FIG. 3b, since the heights of the first metal electrode 2001 and the second metal electrode 2002 of the LED chip 200 have a stepped difference, the solder layer 211 has different thickness at different locations. A portion of the solder layer 211 sandwiched between the second metal electrode 2002 and the second driving electrode 2102 has a larger thickness than a portion of the solder layer 211 sandwiched between the first metal electrode 2001 and the first driving electrode 2101.

As shown in FIG. 3c, the main components of a manufactured micro LED display device 2 are described below. The micro LED display device 2 includes the first substrate 21, the plurality of LED chips 200, a sol-gel glass 212, a plurality of phosphor films 220, and a second substrate 22. The upper surface of the first substrate 21 is provided with the plurality of groups of printed circuits 210, each group of printed circuits 210 includes the first driving electrode 2101 and the second driving electrode 2102. The LED chips 200 are aligned with and attached onto the groups of printed circuits 210 correspondingly. Each LED chip 200 at least includes the N-type semiconductor layer 200a, the light emitting layer 200b, the P-type semiconductor layer 200c, the first metal electrode 2001, and the second metal electrode 2002. As shown in the figure, the first metal electrode 2001 is located on a lower side of the P-type semiconductor layer 200c, the second metal electrode 2002 is located on a lower side of the N-type semiconductor layer 200a, for aligning and electrically communicating with the below first driving electrode 2101 and the second driving electrode 2102 respectively. Moreover, each LED chip 200 is attached to the corresponding group of printed circuits 210 aligned therewith, by the solder layer 211 located between the first metal electrode 2001 and the first driving electrode 2101 as well as located between the second metal electrode 2002 and the second driving electrode 2102. The sol-gel glass 212 adequately fills into gaps among the LED chips 200 and exposes the upper surfaces of the LED chips 200. The phosphor films 220 each are formed on the upper surface of the corresponding LED chip 200 aligned therewith. The second substrate 22 is located on the phosphor films 220 and bonded onto the first substrate 21.

In one embodiment, the method of forming the phosphor films 220 on a surface of the second substrate 22 is not limited, and it may be a method of attaching a film layer, or a method of coating or spraying phosphor powders. The formed phosphor films 220 are arranged in a matrix array and correspond to the LED chips 200 one by one. Except for forming the phosphor films 220 on the surface of the second substrate 22, the phosphor films 220 may be directly formed on the upper surfaces of the LED chips 200 in one embodiment. In addition, the phosphor films 220 are made with different phosphors according to the color of the corresponding sub-pixel region. In this way, when blue lights or ultraviolet lights emitted from the LED chips 100 irradiate the upper phosphor films 220, different phosphors are excited, and different light rays such as red light, blue light, and green light are respectively generated.

In addition, the sol-gel glass 212 is adequately filled into gaps between the adjacent LED chips 200, and is adequately filled into gaps between the adjacent printed circuits 210. That is, the sol-gel glass 212 thoroughly fills gaps among the first metal electrode 2001, the second metal electrode 2002, the first driving electrode 2101, and the second driving electrode 2102.

In one embodiment, the first substrate 21 can be used as an active array substrate. That is, an upper surface of the first substrate 21 can be divided into a plurality of pixel regions distributed in an array. Each pixel region includes three sub-pixel regions of red, blue, and green. The printed circuits 210 in each sub-pixel region are configured for connecting with the corresponding LED chip 200, and thereby controlling and driving the LED chip 200 to emit light.

In one embodiment, the plurality of groups of printed circuits 210 are arranged in a matrix array on the upper surface of the first substrate 21, and each group of printed circuits 210 correspond to one sub-pixel region. The plurality of LED chips 200 correspond to the plurality of groups of printed circuits 210 one by one.

The benefits brought by the present disclosure are described below. The disclosure provides a new micro LED display device and a method for manufacturing the same, capable of greatly increasing yield and reliability. Since the sol-gel glass is applied and coated in a vacuum environment to be filled into gaps among adjacent LED chips, it can be fully and adequately filled into all gaps among related components. In addition to the effect of flattening the surface of the micro LED array, it can further provides the effect of fixing and supporting the micro LEDs, thereby reducing the chance of breakage of the micro LED related components.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method for manufacturing a micro light emitting diode display device, comprising:
   forming a plurality of light emitting diode chips distributed in an array on a supplying substrate, wherein the plurality of light emitting diode chips are for emitting lights of a same color;
   providing a first substrate, wherein an upper surface of the first substrate is divided into a plurality of pixel regions distributed in an array, each of the plurality of pixel regions comprises a plurality of sub-pixel regions of different colors, a plurality of groups of printed circuits are arranged in an array on the upper surface of the first substrate, each group of printed circuits in the plurality of groups of printed circuits correspond to one of the plurality of sub-pixel regions of different colors;
   overlaying the supplying substrate in an inverted manner on the first substrate to make the plurality of light emitting diode chips aligned with and attached onto the plurality of groups of printed circuits and thereby corresponding ones of the plurality of light emitting diode chips are disposed in the plurality of sub-pixel regions of different colors respectively;
   detaching the plurality of light emitting diode chips from the supplying substrate;
   removing the supplying substrate;
   forming a sol-gel glass on the first substrate, wherein the sol-gel glass is filled into gaps among the plurality of light emitting diode chips;
   providing a second substrate having a plurality of phosphor films distributed in an array; and
   bonding the first substrate with the second substrate having the plurality of phosphor films after forming the sol-gel glass on the first substrate and after providing the second substrate having the plurality of phosphor films distributed in an array, and thereby the plurality of light emitting diode chips being interposed between the first substrate and the second substrate;
   wherein the plurality of phosphor films are corresponding to the plurality of light emitting diode chips one by one, phosphor films of the plurality of phosphor films respectively corresponding to the plurality of sub-pixel regions of different colors are made of different phosphors respectively, and the different phosphors are for generating lights of different colors after being excited by the lights of a same color emitted from the corresponding ones of the plurality of light emitting diode chips;
   wherein each of the plurality of light emitting diode chips comprises a first metal electrode and a second metal electrode, each of the plurality of groups of printed circuits comprises a first driving electrode and a second driving electrode; when the plurality of light emitting diode chips are aligned with and attached onto the plurality of groups of printed circuits, each the first metal electrode is attached onto the first driving electrode aligned therewith, each the second metal electrode is attached onto the second driving electrode aligned therewith;
   wherein the sol-gel glass is further filled into gaps among the first metal electrode, the second metal electrode, the first driving electrode and the second driving electrode.

2. The method according to claim 1, wherein an upper surface of each of the plurality of light emitting diode chips facing away from the first substrate is directly in contact with the corresponding one of the plurality of phosphor films.

3. The method according to claim 1, wherein at least one of the first substrate and the second substrate is a glass substrate.

4. The method according to claim 1, wherein forming the sol-gel glass on the first substrate comprises:
   forming the sol-gel glass covering the plurality of light emitting diode chips and the plurality of groups of printed circuits; and
   grinding the sol-gel glass until upper surfaces of the plurality of light emitting diode chips are exposed.

5. The method according to claim 1, wherein overlaying the supplying substrate in an inverted manner on the first substrate to make the plurality of light emitting diode chips aligned with and attached onto the plurality of groups of printed circuits and thereby corresponding ones of the plurality of light emitting diode chips are disposed in the plurality of sub-pixel regions of different colors respectively, comprises:
   forming a solder layer on the plurality of groups of printed circuits; and
   reflow soldering the solder layer to bond the plurality of light emitting diode chips with the plurality of groups of printed circuits respectively.

6. The method according to claim 1, wherein forming the sol-gel glass on the first substrate is performed in a vacuum environment.

7. The method according to claim 5, wherein a portion of the solder layer sandwiched between the first metal electrode and the first driving electrode has a thickness different from that of a portion of the solder layer sandwiched between the second metal electrode and the second driving electrode.

8. A method for manufacturing a micro light emitting diode display device, comprising:
   forming a plurality of light emitting diode chips distributed in an array on a supplying substrate;
   providing a first substrate, wherein an upper surface of the first substrate is divided into a plurality of pixel regions distributed in an array, each of the plurality of pixel regions comprises a plurality of sub-pixel regions of different colors, a plurality of groups of printed circuits are arranged in an array on the upper surface of the first substrate, each group of printed circuits in the plurality of groups of printed circuits correspond to one of the plurality of sub-pixel regions of different colors;
   overlaying the supplying substrate in an inverted manner on the first substrate to make the plurality of light emitting diode chips aligned with and attached onto the plurality of groups of printed circuits and thereby corresponding ones of the plurality of light emitting diode chips are disposed in the plurality of sub-pixel regions of different colors respectively;
   detaching the plurality of light emitting diode chips from the supplying substrate;
   removing the supplying substrate;
   forming a sol-gel glass on the first substrate, wherein the sol-gel glass is filled into gaps among the plurality of light emitting diode chips;
   providing a second substrate having a plurality of phosphor films distributed in an array; and
   bonding the first substrate with the second substrate having the plurality of phosphor films after forming the sol-gel glass on the first substrate and after providing the second substrate having the plurality of phosphor films distributed in an array, and thereby the plurality of light emitting diode chips being interposed between the first substrate and the second substrate;
   wherein the second substrate is a glass substrate being electrically insulated;
   wherein the plurality of phosphor films are corresponding to the plurality of light emitting diode chips one by one, phosphor films of the plurality of phosphor films respectively corresponding to the plurality of sub-pixel regions of different colors are made of different phosphors respectively, and the different phosphors are for generating lights of different colors after being excited by lights emitted from the corresponding ones of the plurality of light emitting diode chips;
   wherein each of the plurality of light emitting diode chips comprises a first metal electrode and a second metal electrode, each of the plurality of groups of printed circuits comprises a first driving electrode and a second driving electrode; when the plurality of light emitting diode chips are aligned with and attached onto the plurality of groups of printed circuits, each the first metal electrode is attached onto the first driving electrode aligned therewith, each the second metal electrode is attached onto the second driving electrode aligned therewith;
   wherein the sol-gel glass is further filled into gaps among the first metal electrode, the second metal electrode, the first driving electrode and the second driving electrode.

9. The method according to claim 8, wherein an upper surface of each of the plurality of light emitting diode chips facing away from the first substrate is directly in contact with the corresponding one of the plurality of phosphor films.

10. The method according to claim 8, wherein forming the sol-gel glass on the first substrate comprises:
    forming the sol-gel glass covering the plurality of light emitting diode chips and the plurality of groups of printed circuits; and
    grinding the sol-gel glass until upper surfaces of the plurality of light emitting diode chips are exposed.

11. The method according to claim 8, wherein overlaying the supplying substrate in an inverted manner on the first substrate to make the plurality of light emitting diode chips aligned with and attached onto the plurality of groups of printed circuits and thereby corresponding ones of the plurality of light emitting diode chips are disposed in the plurality of sub-pixel regions of different colors respectively, comprises:
    forming a solder layer on the plurality of groups of printed circuits; and
    reflow soldering the solder layer to bond the plurality of light emitting diode chips with the plurality of groups of printed circuits respectively.

12. The method according to claim 8, wherein forming the sol-gel glass on the first substrate is performed in a vacuum environment.

13. The method according to claim 11, wherein a portion of the solder layer sandwiched between the first metal electrode and the first driving electrode has a thickness different from that of a portion of the solder layer sandwiched between the second metal electrode and the second driving electrode.

14. The method according to claim 1, wherein providing the second substrate having the plurality of phosphor films distributed in an array, comprises:
    attaching a film layer on a surface of the second substrate to form the plurality of phosphor films.

15. The method according to claim 1, wherein providing the second substrate having the plurality of phosphor films distributed in an array, comprises:
    coating or spraying phosphor powders on a surface of the second substrate to form the plurality of phosphor films.

16. The method according to claim 8, wherein providing the second substrate having the plurality of phosphor films distributed in an array, comprises:
    attaching a film layer on a surface of the second substrate to form the plurality of phosphor films.

17. The method according to claim 8, wherein providing the second substrate having the plurality of phosphor films distributed in an array, comprises:
    coating or spraying phosphor powders on a surface of the second substrate to form the plurality of phosphor films.

* * * * *